United States Patent
Sun (10) Patent No.: US 11,627,273 B2
(45) Date of Patent: Apr. 11, 2023

(54) CURRENT STEERING RAMP COMPENSATION SCHEME AND DIGITAL CIRCUIT IMPLEMENTATION

(71) Applicant: OMNIVISION TECHNOLOGIES, INC., Santa Clara, CA (US)

(72) Inventor: Tao Sun, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 193 days.

(21) Appl. No.: 17/217,950

(22) Filed: Mar. 30, 2021

(65) Prior Publication Data

US 2022/0321815 A1 Oct. 6, 2022

(51) Int. Cl.
| | |
|---|---|
| *H03M 1/56* | (2006.01) |
| *H04N 5/378* | (2011.01) |
| *H03K 4/06* | (2006.01) |
| *H03K 3/037* | (2006.01) |
| *H03M 1/12* | (2006.01) |
| *H03K 4/90* | (2006.01) |
| *H03M 1/34* | (2006.01) |
| *H03K 19/20* | (2006.01) |

(52) U.S. Cl.
CPC .............. *H04N 5/378* (2013.01); *H03K 3/037* (2013.01); *H03K 4/06* (2013.01); *H03K 4/90* (2013.01); *H03M 1/12* (2013.01); *H03M 1/34* (2013.01); *H03K 19/20* (2013.01)

(58) Field of Classification Search
CPC .......... H04N 5/378; H03K 3/037; H03K 4/06; H03K 4/90; H03K 19/20; H03M 1/12; H03M 1/34
See application file for complete search history.

(56) References Cited

U.S. PATENT DOCUMENTS

| | | | |
|---|---|---|---|
| 9,307,173 B2 | 4/2016 | Takamiya et al. | |
| 10,498,993 B1 | 12/2019 | Ebihara et al. | |
| 10,826,470 B2 | 11/2020 | Zuo et al. | |
| 2020/0260037 A1* | 8/2020 | Cho | ...................... H04N 5/3575 |

* cited by examiner

*Primary Examiner* — Joseph J Lauture
(74) *Attorney, Agent, or Firm* — Perkins Coie LLP (57) ABSTRACT

A ramp generator includes a plurality of switched current sources coupled in parallel between a resistor and ground. A digital ramp control signal generator includes a counter to generate a ramp control signal in response to a clock signal. Each bit of the ramp control signal is coupled to control switching of a respective one of the plurality of switched current sources to generate a ramp signal at an output of the ramp generator. The digital ramp control signal generator is coupled to receive a reset signal to zero the ramp control signal. The digital ramp control signal generator is further coupled to receive a set bits signal to initialize the ramp signal to a preset value after every reset of the ramp control signal to add a DC offset compensation current determined by the preset value to the ramp signal.

22 Claims, 6 Drawing Sheets

CURRENT STEERING RAMP COMPENSATION SCHEME AND DIGITAL CIRCUIT IMPLEMENTATION

BACKGROUND INFORMATION

Field of the Disclosure

This disclosure relates generally to image sensors, and in particular but not exclusively, relates to a ramp generator in an image sensor.

Background

Image sensors have become ubiquitous and are now widely used in digital cameras, cellular phones, security cameras as well as in medical, automotive, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing. The technology used to manufacture image sensors has continued to advance at a great pace. For example, the demands of higher resolution and lower power consumption have encouraged the further miniaturization and integration of these devices.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which are read out as analog signals from the column bitlines and converted to digital values to produce digital images (i.e., image data) that represent the external scene.

Analog to digital converters (ADCs) are often used in CMOS image sensors (CIS) to convert the charge into a digital representation of the charge by the image sensor. The ADCs generate the digital representations of the charge based on a comparison of an image charge signal to a reference voltage signal. The reference voltage signal may conventionally be a ramp signal provided by a ramp generator and the comparison may conventionally be performed by a comparator, which provides an output that can be used with a counter to generate the digital representation of the image charge.

It is appreciated that the ramp settling time, or delay, of the ramp signal that is generated by the ramp generator and received by the comparator can limit the maximum frame rate of the image sensor. Thus, reducing the ramp settling time of the ramp signal that is received by the comparator can increase the maximum frame rate and therefore the performance of the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system including a readout circuit with a ramp generator with a compensated current source are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including a readout circuit with a ramp generator with a compensated current source are described. In various examples, the ramp generator includes a plurality of switched current sources that are coupled in parallel between a resistor and ground. The output of the ramp generator is coupled to a node between the resistor and the plurality of switched current sources. In the various examples, the ramp generator also includes a digital ramp control signal generator that includes a counter configured to generate a ramp control signal in response to a clock signal. The ramp control signal comprises a plurality of bits. Each bit of the ramp control signal is coupled to control switching of a respective one of the plurality of switched current sources to generate a ramp signal at the output of the ramp generator. The digital ramp control signal generator is coupled to receive a reset signal, which zeroes the ramp control signal. The digital ramp control signal generator is also coupled to receive a set bits signal, which initializes the ramp signal to a preset value after every reset of the ramp control signal. The initialized ramp signal value adds a DC offset compensation current determined by the preset value to the ramp signal. The DC offset compensation current that is added to the ramp signal compensates the ramp signal and reduces a ramp settling time of the ramp signal that is caused by loading of the ramp generator by the comparator circuit, which therefore improves maximum frame rate and image sensor performance in accordance with the teachings of the present invention.

Figure 1:
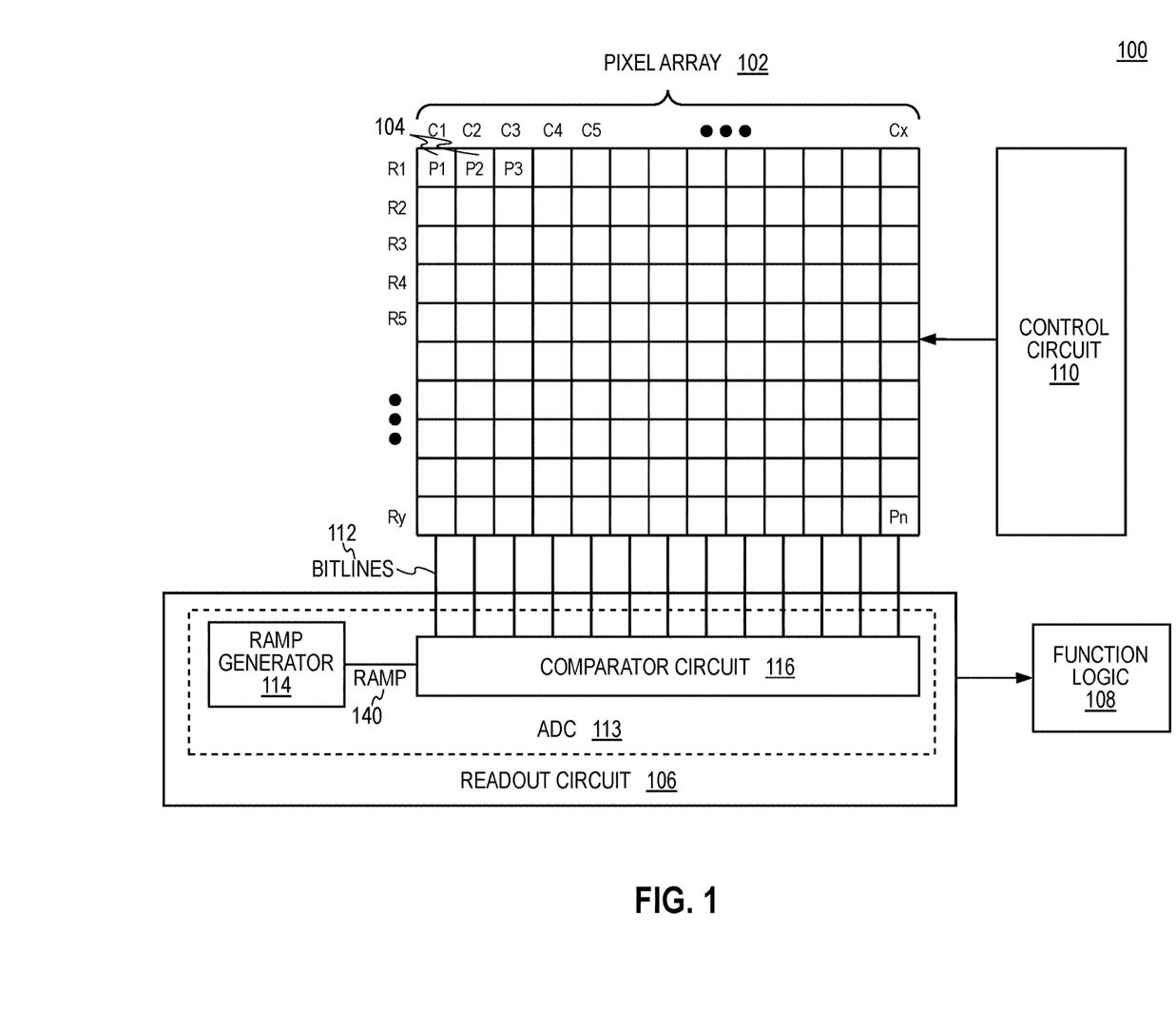
FIG. 1 illustrates one example of an imaging system including a readout circuit with a ramp generator with a compensated current source in accordance with the teachings of the present invention.

To illustrate, FIG. 1 illustrates one example of an imaging system 100 including a readout circuit with a ramp generator with a compensated current source in accordance with the teachings of the present invention. As shown in the illustrated example, imaging system 100 includes a pixel array 102, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

In various examples, the each pixel circuit 104 may include one or more photodiodes configured to photogenerate image charge in response to incident light. The image charge generated in each photodiode is transferred to a floating diffusion in each pixel circuit 104, which is converted to an image signal and then read out from each pixel circuit 104 by readout circuit 106 through column bitlines 112. In the various examples, readout circuit 106 may read out a row of image data at a time along readout column bitlines 112 (illustrated) or may read out the image data using a variety of other techniques (not illustrated), such as a serial readout or a full parallel readout of all pixel circuits 104 simultaneously.

In various examples, readout circuit 106 may include amplification circuitry, an analog to digital (ADC) converter (ADC) 113, or otherwise. In the depicted example, ADC 113 includes a comparator circuit 116 coupled to receive the image signals from pixel array 102 through the column bitlines 112. In one example, the comparator circuit 116 may include a plurality of comparators coupled to receive the image signals through the bitlines 112. In the example, each of the comparators included in comparator circuit 116 is also coupled to receive a ramp signal 140 from a ramp generator 114 as shown. In the example, each comparator included in comparator circuit 116 may be used to determine a digital representation of the image signal using a counter based on a comparison of ramp signal 140 to the image signal voltage level received through bitlines 112. As will be discussed in further detail below, the ramp settling time, or delay, of the ramp signal 140 that is generated by the ramp generator 114 and received by the comparator circuit 116 is reduced to increase the maximum frame rate and therefore improve the performance of the imaging system 100 in accordance with the teachings of the present invention.

In the example, the digital image data values generated by ADC 113 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixel circuits 104 within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2A:
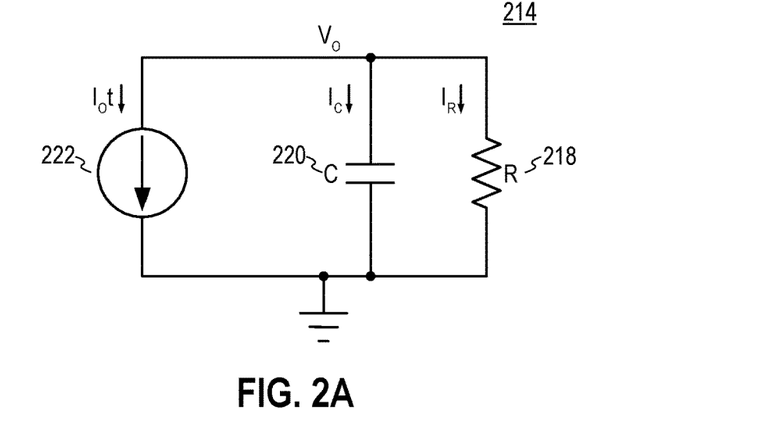
FIG. 2A shows a circuit model of an example of a ramp generator without compensation that generates a ramp signal in a readout circuit of an imaging system.

FIG. 2A shows a circuit model of an example of a ramp generator 214 without compensation that generates a ramp signal in a readout circuit of an imaging system. In the example depicted in FIG. 2A, ramp generator 214 includes a ramp current source 222 that provides a current $I_ot$, which is coupled provide a ramp signal that is coupled to a resistance R 218 and a loading capacitance C 216, which may be typical of a comparator circuit 116 described in FIG. 1.

Figure 2B:
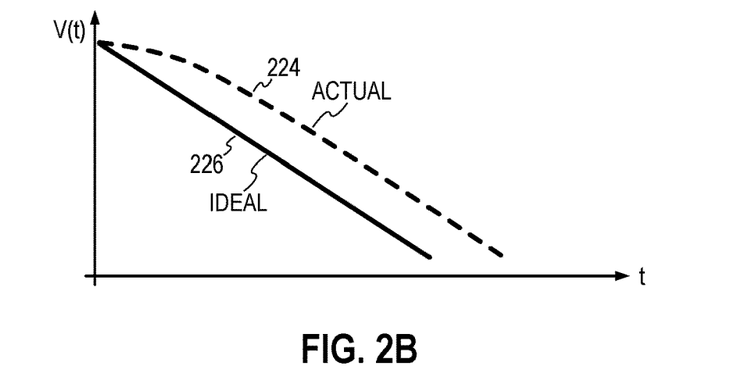
FIG. 2B is a timing diagram that illustrates a ramp signal generated by the example ramp generator without compensation illustrated in FIG. 2A compared to an ideal ramp signal generated by an example ramp generator with a compensated current source in accordance with the teachings of the present invention.

FIG. 2B is a timing diagram that illustrates an actual ramp signal 224 generated by the example ramp generator 214 without compensation illustrated in FIG. 2A compared to an ideal ramp signal 226 generated by an example ramp generator with a compensated current source in accordance with the teachings of the present invention. As shown in the example depicted in FIG. 2B, the ideal ramp signal 226 (solid line) illustrates what the ramp signal would be without the loading capacitance C. However, the actual ramp signal 224 (dashed line) shows that the actual ramp signal 224 has a non-linearity and is delayed from the ideal ramp signal due to the ramp settling time caused by the resistance R 218 and the loading capacitance C 220 coupled to the ramp current source 222. In other words, the slow actual ramp signal 224 settles slowly and has a DC error from the ideal ramp signal 226 due to the presence of the loading capacitance 220.

The non-linear delayed ramp event in the actual ramp signal 224 can be characterized in Equation (1) below:

$$V_O(t) = V_O - I_O R t + I_O R^2 C \left(1 - e^{-\frac{t}{RC}}\right) \quad (1)$$

In comparison, the linear ramp event in the ideal ramp signal 226 can be characterized in
Equation (2) below:

$$V_o(t) = V_o I_o R t \quad (2)$$

It is appreciated therefore that the delay of the linear ideal ramp signal 226 is related to the RC time constant τ (time constant of V(t): τ=RC) caused by the loading capacitance C 220, and that the non-linear portion of the ramp signal characterized in Equation (1) above can is characterized by Equation (3) below:

$$I_O R^2 C \left(1 - e^{-\frac{t}{RC}}\right) \quad (3)$$

The non-linear portion of the ramp event in the ramp signal characterized in Equation (3) above is not useful for analog to digital conversion. Consequently, the analog to digital conversion is delayed until the linear portion of the ramp event in the ramp signal. A major consequence of the non-linear portion of the ramp signal is increased ramp settling time, which increases the amount of time required to read image data from the image sensor, which decreases the possible maximum frame rate of the image sensor.

Figure 3:
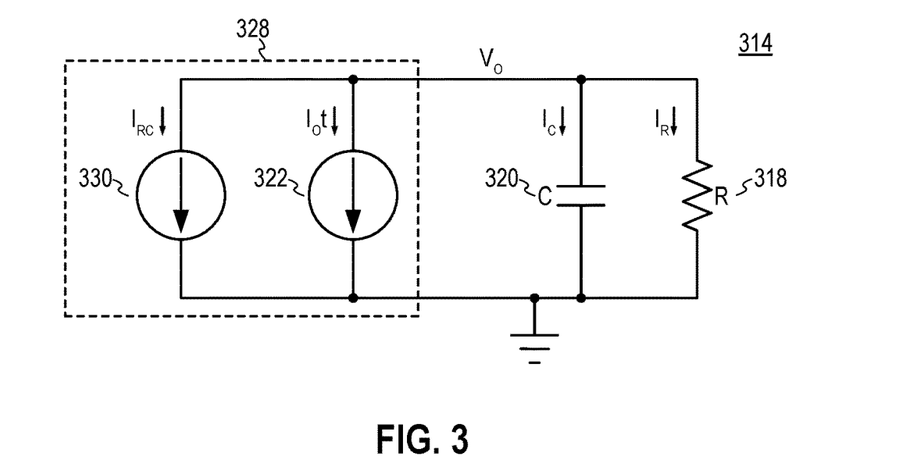
FIG. 3 shows a circuit model of an example ramp generator with a compensated current source that generates a ramp signal in accordance with the teachings of the present invention.

FIG. 3 shows a circuit model of an example ramp generator 314 with a compensated current source that generates a ramp signal in accordance with the teachings of the present invention. It is noted that ramp generator 314 of FIG. 3 may be an example of ramp generator 114 of FIG. 1, and that similarly named and numbered elements referenced below are coupled and function similar to as described above. It is noted that ramp generator 314 of FIG. 3 shares some similarities with ramp generator 214 of FIG. 2A. For instance, in the example depicted in FIG. 3, ramp generator 314 includes a ramp current source 322 that provides a current Tot to generate a ramp signal $V_o$, which is coupled to comparator circuit load having an effective resistance R 318 and loading capacitance C 316.

However, one difference between ramp generator 314 of FIG. 3 and ramp generator 214 of FIG. 2A, is that ramp generator 314 of FIG. 3 also includes a DC offset current source 330 coupled in parallel with ramp current source 322. In the example, the DC offset current source 330 is configured to conduct a DC current equal to $I_{RC}$ as shown. In the example, ramp current source 322 and DC offset current source 330 combine to form a compensated current source 328 in accordance with the teachings of the present invention.

Continuing with the example depicted in FIG. 3, the ramp signal provided by ramp generator 314 can be characterized in Equation (4) below:

$$V_O(t) = V_O - I_O R t + I_O R^2 C \left(1 - e^{-\frac{t}{RC}}\right) - I_{RC} R \left(1 - e^{-\frac{t}{RC}}\right) \quad (4)$$

The portion of Equation (4) above that can be attributed to the DC offset current source 330 can be characterized by Equation (5) below:

$$I_{RC} R \left(1 - e^{-\frac{t}{RC}}\right) \quad (5)$$

The $I_{RC}$ current provided by the DC offset current source 330 can then be set according to Equation (6) below:

$$I_{RC} = I_O R C$$

Substituting $I_{RC} = I_o R C$ of Equation (6) into Equation (4) above results in Equation (7) below:

$$V_O(t) = V_O - I_O R t + I_O R^2 C \left(1 - e^{-\frac{t}{RC}}\right) - I_O R^2 C \left(1 - e^{-\frac{t}{RC}}\right) \quad (7)$$

As can be observed in Equation (7) above, the last two terms cancel each other, which results in Equation (8) below:

$$V_o(t) = V_0 - I_o R t \quad (8)$$

As can be appreciated, Equation (8) is the same as Equation (2) discussed above, and therefore results in the ramp signal provided by ramp generator 314 to be the same as the ideal linear ramp signal 226 shown in FIG. 2B in accordance with the teachings of the present invention.

Figure 4:
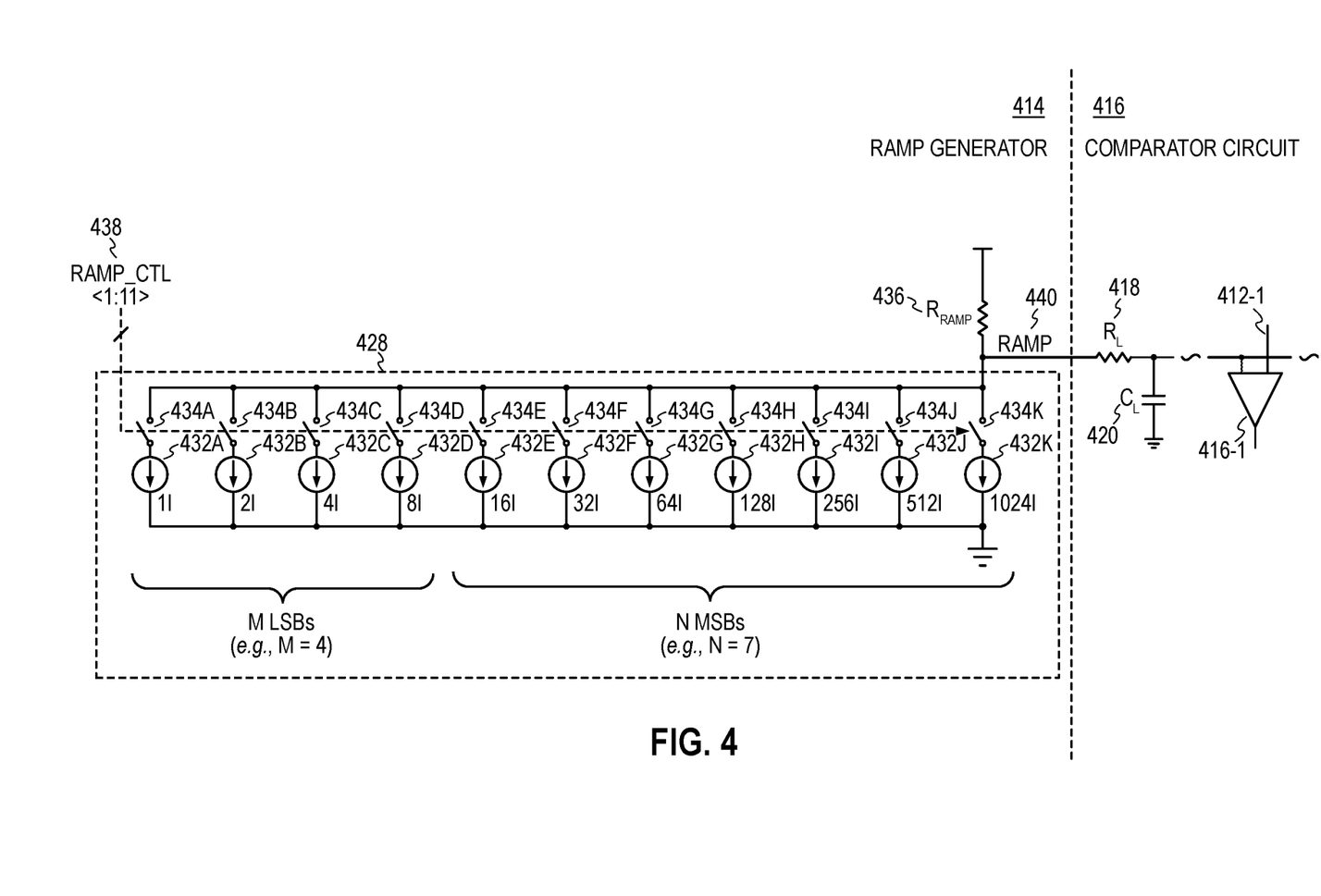
FIG. 4 shows a schematic of an example ramp generator with a compensated current source in accordance with the teachings of the present invention.

FIG. 4 shows a schematic of an example ramp generator 414 including an example compensated current source in accordance with the teachings of the present invention. It is noted that ramp generator 414 of FIG. 4 may be an example of ramp generator 314 of FIG. 3, and/or an example of ramp generator 114 of FIG. 1, and that similarly named and numbered elements referenced below are coupled and function similar to as described above. As shown in the example of FIG. 4, ramp generator 414 is configured to generate a ramp signal 440, which in the depicted example is coupled to be received by a comparator circuit 416.

It is noted that example comparator circuit 416 of FIG. 4 may be an example comparator 116 shown in FIG. 1 and/or described in FIG. 3, and that similarly named and numbered elements referenced below are coupled and function similar to as described above. As such, comparator circuit 416 is illustrated in FIG. 4 as having an effective load resistance $R_L$ 418 and load capacitance $C_L$ 420 coupled to the output of ramp generator 414 to receive the ramp signal 440. In the example, comparator circuit 416 includes a plurality of comparators, of which comparator 416-1 is illustrated. In the example, each of the plurality of comparators has a first input coupled to receive the ramp signal 440 and a second input coupled to receive an analog image signal through a respective bitline 412-1 as shown. In the example, a digital representation of the analog image signal can be determined based on the comparison output of the comparator 416-1.

As shown in the example depicted in FIG. 4, ramp generator 414 includes a compensated current source 428, which includes a plurality of switched current sources coupled in parallel between a resistor $R_{RAMP}$ 436 and ground. In the example, each one of the plurality of switched current sources includes a current source 432A-432K coupled to a respective switch 434A-432K. As such, each current source 432A-432K can be switched on or off by switching their respective switches 434A-434K accordingly.

In the example, the plurality of switched current sources are binary weighted current sources representing M+N bits. In the example, there are M least significant bits (LSB s) and N most significant bits (MSB s). In the illustrated example, it is noted that M=4 and N=7 for explanation purposes. As such, there are a total of 11 binary weighted current sources in the depicted example for explanation purposes. In other examples, it is appreciated that M and N may take on different values.

With the binary weighting of the current sources in the example depicted in FIG. 4, it is noted that current source 432A provides a current of 1I, current source 432B provides a current of 2I, current source 432C provides a current of 4I, current source 432AD provides a current of 8I, current source 432E provides a current of 16I, current source 432F provides a current of 32I, current source 432G provides a current of 64I, current source 432H provides a current of 128I, current source 432I provides a current of 256I, current source 432J provides a current of 512I, and current source 432K provides a current of 1024I.

In operation, the switching of the plurality of switched current sources is controlled in response to a ramp control signal RAMP_CTL<1:11>438. In the depicted example, ramp control signal RAMP_CTL<1:11>438 includes 11 bits, with each bit coupled to control a respective switch 432A-432K of the plurality of switched current sources as shown in FIG. 4. As will be discussed below, a digital ramp control signal generator is configured to generate the M+N bit (e.g., 11 bit) ramp control signal RAMP_CTL<1:11>438. In one example, the digital ramp control signal generator includes a counter to generate ramp control signal RAMP_CTL<1:11>438, which controls the switching of each of the plurality of switched current sources to generate ramp signal 440 at the output of the ramp generator 414 at the node between the resistor $R_{RAMP}$ 436 and the plurality of switched current sources.

Figure 5:
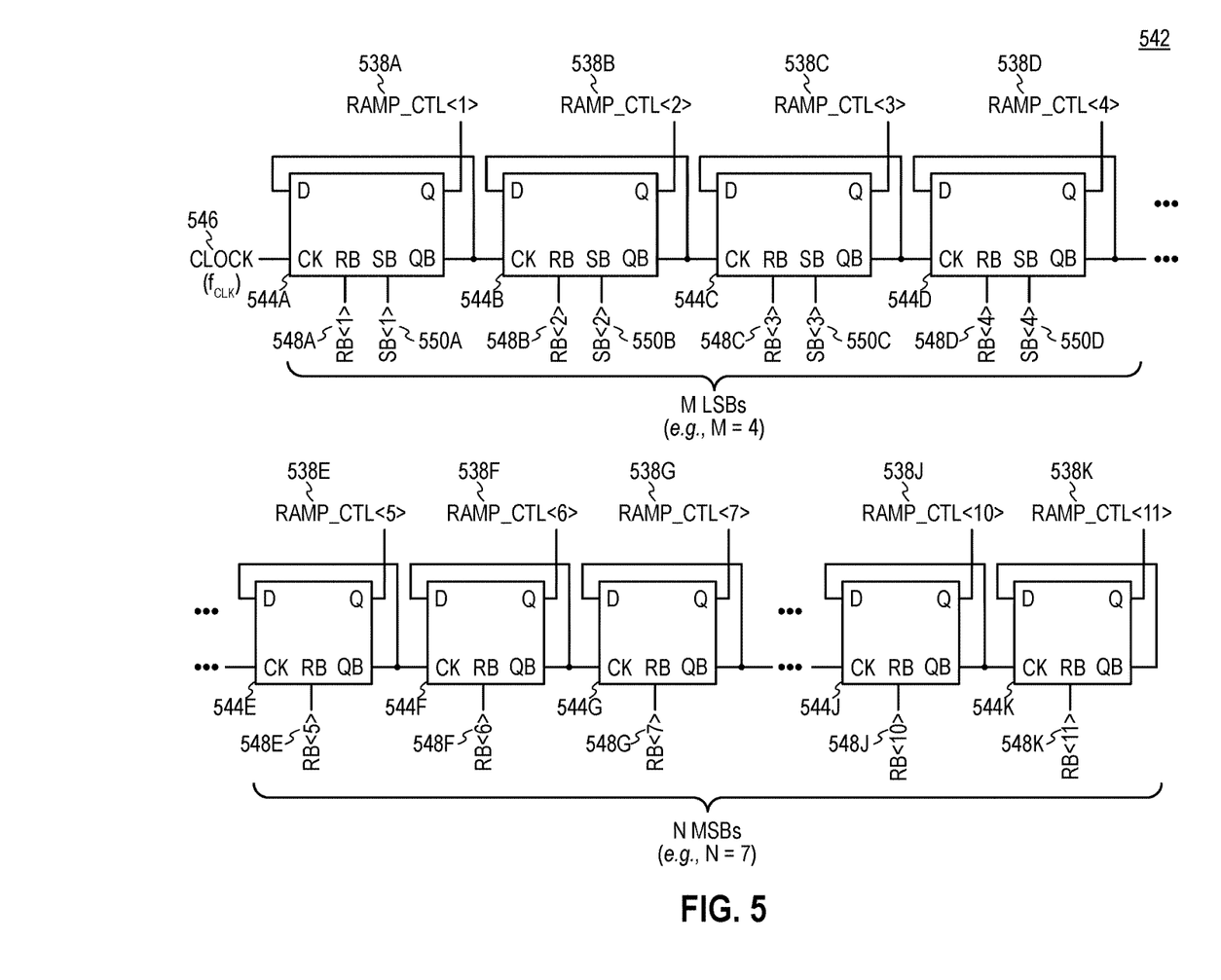
FIG. 5 shows a schematic of an example digital ramp control signal generator coupled to control an example ramp generator with a compensated current source in accordance with the teachings of the present invention.

To illustrate, FIG. 5 shows a schematic of an example digital ramp control signal generator 542, which is configured to generate a ramp control signal to control an example ramp generator with a compensated current source in accordance with the teachings of the present invention. It is noted that the ramp control signal generated by the digital ramp control signal generator 542 of FIG. 5 may be an example of the ramp control signal RAMP_CTL<1:11>438 coupled to control ramp generator 414 of FIG. 4, and that similarly named and numbered elements referenced below are coupled and function similar to as described above.

In particular, the example depicted in FIG. 5 shows that digital ramp control signal generator 542 includes a counter that is configured to generate an M+N bit ramp control signal, which includes ramp control signal bits RAMP_CTRL <1>538A to RAMP_CTRL<11>538K. In the depicted example, the counter is an M+N bit ripple counter which includes M+N cascade-coupled flip-flops 544A to 544K that are coupled in sequence as shown. The M least significant bit (LSB) flip flops 544A to 544D are configured to generate the M LSB ramp control signal bits RAMP_CTRL <1>538A to RAMP_CTRL<4>538D, respectively. The N most significant bit (MSB) flip flops 544E to 544K are configured to generate the N MSB ramp control signal bits RAMP_CTRL <5>538E to RAMP_CTRL<11>538K, respectively. The first LSB flip-flop 544A is coupled to be clocked in response to a clock signal 546 having a clock frequency of $f_{CLK}$. The remaining flip-flops 544B to 544K are coupled to be clocked in response to the inverted QB output of the preceding flip-flop of the counter. In the depicted example, the D input of each flip-flop 544A to 544K is coupled to receive its inverted QB output as shown. The Q output of each flip-flop is configured to generate a respective ramp control signal bit RAMP_CTRL<1>538A to RAMP_CTRL<11>538K as shown. As discussed above, each ramp control signal bit RAMP_CTRL<1>538A to RAMP_CTRL<11>538K is configured to control a respective switch 434A to 434K of a respective one of the plurality of binary weighted current sources 432A to 432K to generate the ramp signal 440 at the output of the ramp generator 414 described in detail above in FIG. 4.

Referring back to the example depicted in FIG. 5, each flip-flop 548A to 548K is coupled to receive a respective reset bit signal RB<1>548A to RB<11>548K. In one example, each reset bit signal RB<1>548A to RB<11>548K is the same reset signal. In another example, one or more of each reset bit signal RB<1>548A to RB<11>548K may be individually controlled for each respective bit. In operation the reset bit signals RB<1>548A to RB<11>548K are configured to zero the ramp control signal bits RAMP_CTRL<1>538A to RAMP_CTRL<11>538K. In operation, this reset operation may occur prior to each ramp event in the ramp signal 440 to initialize the ramp signal 440.

Continuing with the depicted example, FIG. 5 also shows that each of the M LSB flip-flops 544A to 544D are also coupled to receive a set bit signal SB<1>550A to SB<4>550D, respectively. In operation, set bit signals SB<1>550A to SB<4>550D initialize the ramp signal 440 to a preset value after every reset operation of the ramp control signal bits RAMP_CTL<1>538A to RAMP_CTL<11>538K, which adds a DC offset compensation current determined by the preset value to the ramp signal 440 in accordance with the teachings of the present invention. In the example depicted in FIG. 5, the N MSB flip-flops 544E to 544K are not coupled to receive any set bit signals, and therefore remain being reset to zero after the reset operation.

In operation, the preset value used to determine the values of the set bit signals SB<1>550A to SB<4>550D provides a DC offset compensation current as discussed above with respect to FIG. 3 according to Equation (6). Therefore, in one example, the preset value used to determine the set bit signals SB<1>550A to SB<4>550D to preset flip-flops 544A to 544D after each reset operation is determined based on Equation (9) below:

$$\text{Preset Value} \approx RCf_{CLK} \qquad (9)$$

In the example, R is the load resistance $R_L$ 418 of the comparator circuit 416, C is the effective load capacitance $C_L$ 420 of the comparator circuit 416, and $f_{CLK}$ is the frequency of the clock signal 546 used to clock the counter of digital ramp control signal generator 542.

Therefore, in operation, the ramp signal 440 is initialized or preset to the preset value for a DC offset current based on $I_{RC}$, or $RCf_{CLK}$, which is set with the set bit signals SB<1>550A to SB<4>550D after each reset event prior to each ramp event of ramp signal 440 in accordance with the teachings of the present invention.

Figure 6:
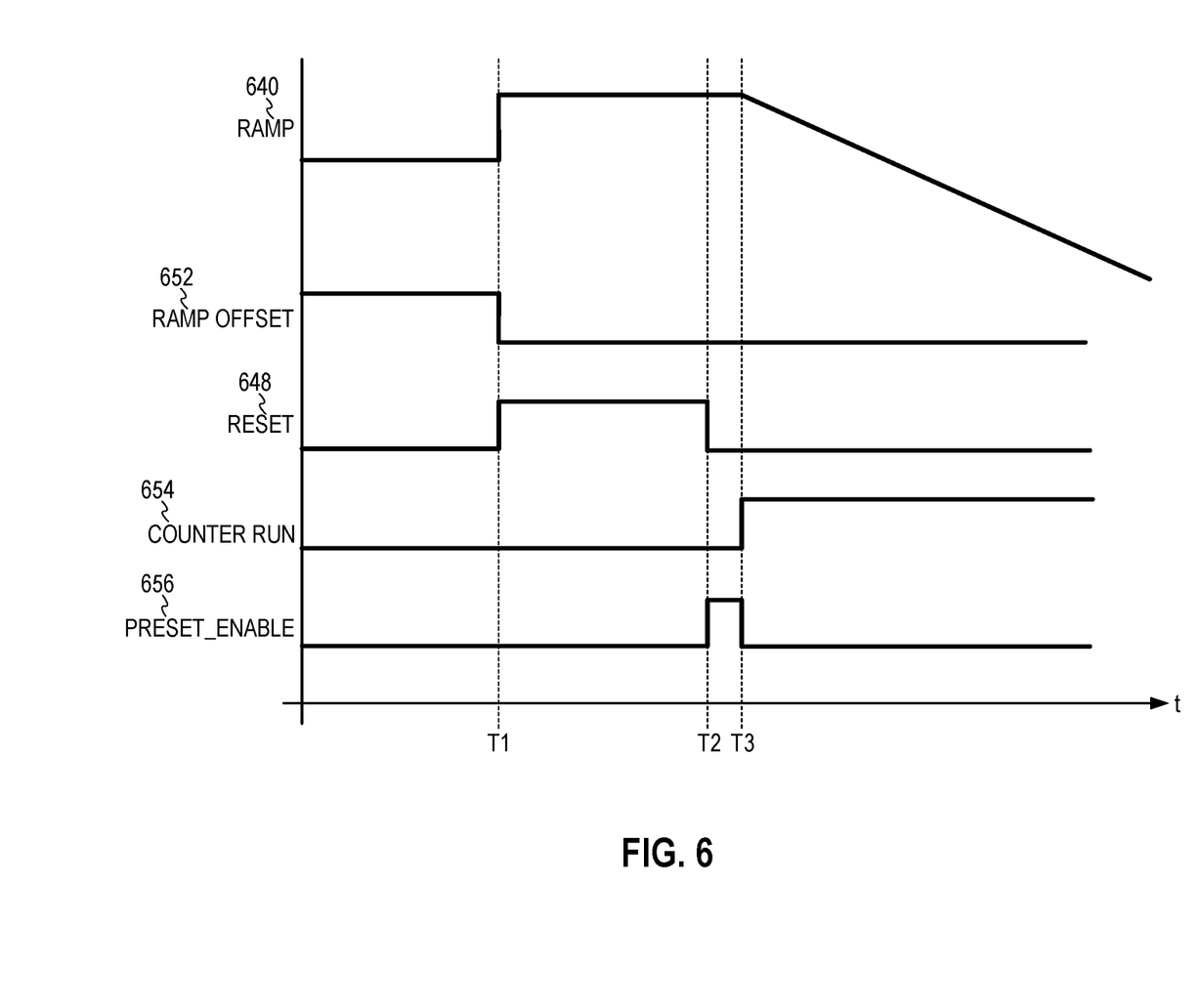
FIG. 6 is a timing diagram that illustrates various waveforms included in an example ramp generator with a compensated current source in accordance with the teachings of the present invention.

FIG. 6 is a timing diagram that illustrates various waveforms included in an example ramp generator with a compensated current source in accordance with the teachings of the present invention. It is appreciated that the waveforms illustrated in FIG. 6 may be examples of waveforms found in digital ramp control signal generator 542 of FIG. 5, and/or in ramp generator 414 of FIG. 4, and/or ramp generator 114 of FIG. 1, and that similarly named and numbered elements referenced below are coupled and function similar to as described above.

As shown in the depicted example, FIG. 6 illustrates a ramp signal 640, a ramp offset signal 652, a reset signal 648, a counter run signal 654, and a preset enable signal 656. As shown in the example, the ramp signal 640 transitions from a first level to a second level at time T1 in response to a transition of the ramp offset signal 652.

At the same time, the reset signal 648 transitions from a logic low level to a logic high level at time T1 to perform a reset operation. In one example, it is noted that the reset signal 648 corresponds to the reset bit signals RB<1>548A to RB<11>548K discussed in FIG. 5. As such, the flip-flops 544A to 544K are reset or zeroed at time T1 in response to the assertion of reset signal 648 as shown.

At time T2, the reset signal 648 is de-asserted and the preset enable signal 656 is asserted. At time T3, the preset enable signal 656 is then de-asserted as shown. As will be discussed in greater detail below, time T3 occurs one clock cycle of clock signal 546 shown in FIG. 5 after time T2. In the example, the preset enable signal 656 is therefore configured to be asserted for one clock cycle of clock signal 546 after the reset signal 648 is de-asserted. In operation, the set bit signals SB<1>550A to SB<4>550-D are configured to initialize or preset the M LSB flip-flops 544A to 544D shown in FIG. 5 to the preset value during the period between T2 and T3 to provide the ramp signal 440, or initialize the ramp signal 440, with a preset DC offset compensation current as discussed above with respect to FIG. 3 in accordance with the teachings of the present invention.

After the the M LSB flip-flops 544A to 544D shown in FIG. 5 are initialized or preset to the preset value during the period between T2 and T3, the counter run signal 654 is asserted at time T3, which begins the ramp event in ramp signal 640 as shown in FIG. 6. Thus, the ramp event beginning at time T3 in ramp signal 640 is compensated with the DC offset compensation current and is therefore linear with minimal ramp settling time in accordance with the teachings of the present invention. It is noted that after the compensated ramp event in ramp signal 640, the process shown in FIG. 6 may then be repeated as needed for the next compensated ramp event of ramp signal 640 in accordance with the teachings of the present invention.

Figure 7A:
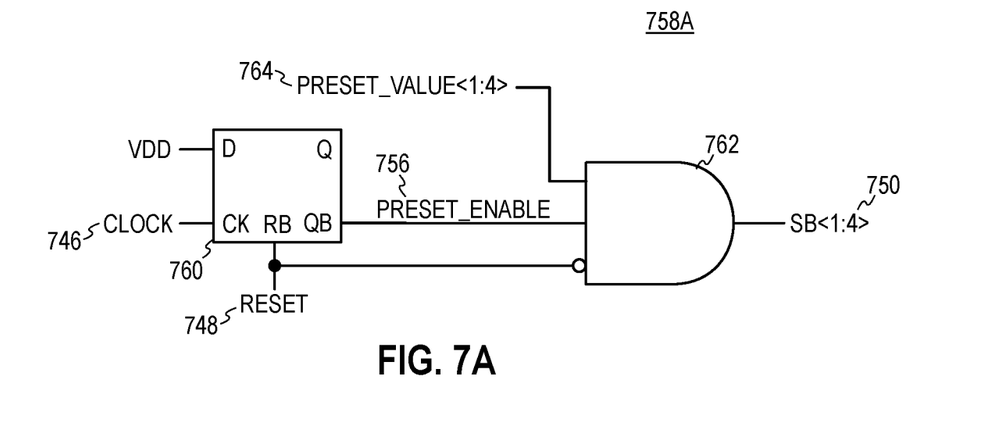
FIGS. 7A-7C are example schematics of various logic circuits used to generate signals coupled to control an example digital ramp control signal generator coupled to an example ramp generator with a compensated current source in accordance with the teachings of the present invention.
Figure 7B:
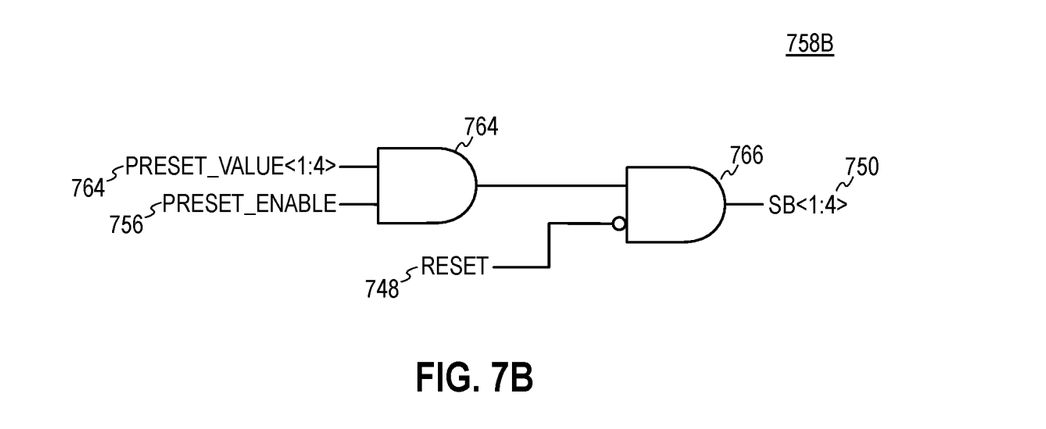
Figure 7C:
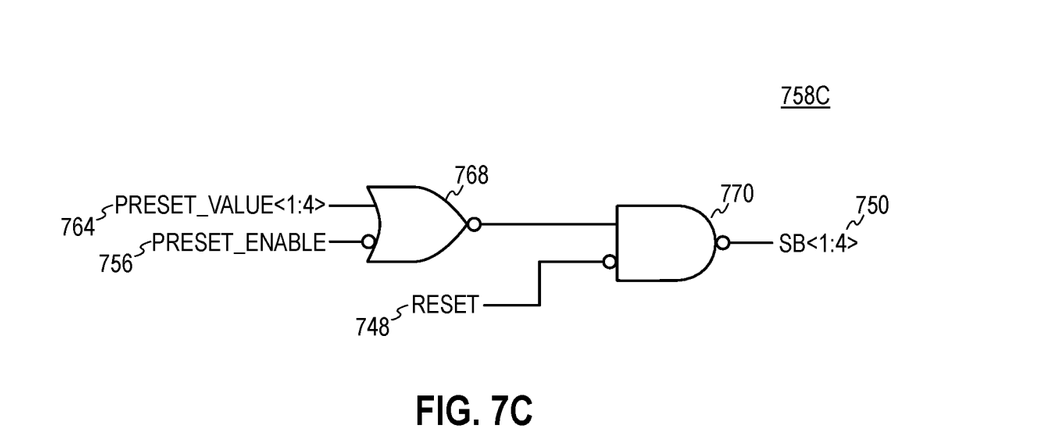

FIGS. 7A-7C are example schematics of various logic circuits used to generate signals coupled to control an example digital ramp control signal generator coupled to in an example ramp generator with a compensated current source in accordance with the teachings of the present invention. It is appreciated that the signals described in FIGS. 7A-7C may be examples of the waveform signals illustrated in FIG. 6 to control an example digital ramp control signal generator, and/or examples of signals coupled to control the example digital ramp control signal generator 542 of FIG. 5, and/or in ramp generator 414 of FIG. 4, and/or ramp generator 114 of FIG. 1, and that similarly named and numbered elements referenced below are coupled and function similar to as described above.

For instance, FIG. 7A illustrates a schematic of one example of a set bit control signal generator 758A in accordance with the teachings of the present invention. As shown in the depicted example, set bit control signal generator 758 is configured to generate the set bit signal SB<1:4>750 in response to a clock signal 746, a reset signal 748, and a preset value signal PRESET_VALUE <1:4>764. In the depicted example, it is noted that the set bit signal SB<1:4>750 and the preset value signal PRESET_VALUE <1:4>764 are illustrated as 4 bit signals, which corresponds to the example M=4 MSBs illustrated in the examples depicted in FIGS. 4-5 above. It is appreciated that in other examples in which M is equal a different value that the set bit signal SB<1:4>750 and the preset value signal PRESET_VALUE <1:4>764 may include the different number of bits, accordingly.

Continuing with the example depicted in FIG. 7A, set bit control signal generator 758A includes a flip flop 760 having a D input coupled to a logic high value (e.g., VDD), a clock input CK coupled to receive the clock signal 746, and a reset input RB (e.g., reset bit input) coupled to receive the reset signal 748. In operation, the flip flop 760 is configured to generate a preset enable signal PRESET_ENABLE 756 at its inverted output QB in response to the reset signal 748 and the clock signal 746. Therefore, it is appreciated that the preset enable signal PRESET_ENABLE 756 is asserted (e.g., logic high) for one clock cycle of the clock signal 746 after the reset signal 748 is de-asserted in accordance with the teachings of the present invention.

The example depicted in FIG. 7A also shows that set bit control signal generator 758A includes a logical AND circuit 762 having a first input coupled to receive a preset value signal PRESET_VALUE<1:4>764, a second input coupled to receive the preset enable signal PRESET_ENABLE 756 from the inverted QB output flip flop 746, and an inverted input coupled to receive the reset signal 748. As such, the set bit signal SB<1:4>750 generated at the output of the logical AND circuit 762 and is equal to the preset value signal PRESET_VALUE<1:4>764 for the one clock cycle that the preset enable signal PRESET_ENABLE 756 is logic high after the reset signal 748 has been de-asserted (e.g., logic low). It is appreciated therefore that the that the set bit signal SB<1:4>750 is equal to the preset value signal PRESET_VALUE<1:4>764 during the one clock cycle between time T2 and time T3 as discussed in FIG. 6 to provide the DC offset compensation current to the ramp signal in accordance with the teachings of the present invention.

FIG. 7B illustrates another example of a set bit control signal generator 758B in accordance with the teachings of the present invention. In particular, it is noted that set bit control signal generator 758B illustrates another example implementation of logical AND circuit 762 of FIG. 7A. As shown, set bit control signal generator 758B includes a first AND gate 764 having a first input coupled to receive the preset value signal PRESET_VALUE<1:4>764, and a second input coupled to receive the preset enable signal PRESET_ENABLE 756. In one example, it is appreciated that preset enable signal PRESET_ENABLE 756 may be received from the inverted QB output of the flip flop 760 shown in FIG. 7A. In another example, it is appreciated that the second input of AND gate 764 may be an inverted input and that the preset enable signal PRESET_ENABLE 756 may be received from the non-inverted Q output of flip flop 760.

FIG. 7B shows that set bit control signal generator 758B also includes a second AND gate 766 having a first input coupled to an output of the first AND gate 764, and an inverted input coupled to receive the reset signal 748. As such, it is appreciated that the set bit signal SB<1:4>750 is generated at the output of second AND gate 766. In operation, the set bit signal SB<1:4>750 is equal to the preset value signal PRESET_VALUE<1:4>764 for the one clock cycle that the preset enable signal PRESET_ENABLE 756 is logic high after the reset signal 748 has been de-asserted (e.g., logic low). It is appreciated therefore that the that the set bit signal SB<1:4>750 is equal to the preset value signal PRESET_VALUE<1:4>764 during the one clock cycle between time T2 and time T3 as discussed in FIG. 6 to provide the DC offset compensation current to the ramp signal in accordance with the teachings of the present invention.

FIG. 7C illustrates yet another example of a set bit control signal generator 758C in accordance with the teachings of the present invention. In particular, it is noted that set bit control signal generator 758C illustrates another example implementation of logical AND circuit 762 of FIG. 7A. As shown, set bit control signal generator 758C includes a NOR gate 768 having a first input coupled to receive the preset value signal PRESET_VALUE<1:4>764, and an inverted input coupled to receive the preset enable signal PRESET_ENABLE 756. In one example, it is appreciated that preset enable signal PRESET_ENABLE 756 may be received from the inverted QB output of flip flop 760 shown in FIG. 7A. In another example, it is appreciated that the second input of NOR gate 768 may be a non-inverted input and that the preset enable signal PRESET_ENABLE 756 may be received from the non-inverted Q output of flip flop 760.

FIG. 7C shows that set bit control signal generator 758C also includes a NAND gate 770 having a first input coupled to an output of the NOR gate 768, and an inverted input coupled to receive the reset signal 748. As such, it is appreciated that the set bit signal SB<1:4>750 is generated at the output of NAND gate 770. In operation, the set bit signal SB<1:4>750 is equal to the preset value signal PRESET_VALUE<1:4>764 for the one clock cycle that the preset enable signal PRESET_ENABLE 756 is logic high after the reset signal 748 has been de-asserted (e.g., logic low). It is appreciated therefore that the that the set bit signal SB<1:4>750 is equal to the preset value signal PRESET_VALUE<1:4>764 during the one clock cycle between time T2 and time T3 as discussed in FIG. 6 to provide the DC offset compensation current to the ramp signal in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A ramp generator, comprising:
a plurality of switched current sources coupled in parallel between a resistor and ground, wherein an output of the ramp generator is coupled to a node between the resistor and the plurality of switched current sources; and
a digital ramp control signal generator comprising a counter configured to generate a ramp control signal in response to a clock signal, wherein the ramp control signal comprises a plurality of bits, wherein each bit of the ramp control signal is coupled to control switching of a respective one of the plurality of switched current sources to generate a ramp signal at the output of the ramp generator,
wherein the digital ramp control signal generator is coupled to receive a reset signal to zero the ramp control signal, wherein the digital ramp control signal generator is further coupled to receive a set bits signal to initialize the ramp signal to a preset value after every reset of the ramp control signal to add a DC offset compensation current determined by the preset value to the ramp signal.

2. The ramp generator of claim 1, wherein the ramp control signal comprises M least significant bits (LSB s) and N most significant bits (MSB s), wherein the plurality of switched current sources comprises M LSB switched binary weighted current sources coupled to N MSB switched binary weighted current sources.

3. The ramp generator of claim 2, wherein the digital ramp control signal generator comprises a ripple counter comprising a M+N flip flops.

4. The ramp generator of claim 3, wherein each of the M+N flip flops of the ripple counter is coupled to receive the reset signal to zero the ramp control signal.

5. The ramp generator of claim 4, wherein the M LSB flip flops of the ripple counter are coupled to receive the set bits signal to initialize the ramp control signal to the preset value after every reset of the ramp signal to add a DC offset compensation current to the ramp signal, wherein the N MSB flip flops of the ripple counter are not coupled to receive the set bits signal.

6. The ramp generator of claim 1, further comprising a set bit control signal generator configured to generate the set bit signal in response to the clock signal, the reset signal, and a preset value signal.

7. The ramp generator of claim 6, wherein the set bit control signal generator comprises:
a flip flop having an input coupled to a logic high value, a clock input coupled to receive the clock signal, and a reset input coupled to receive the reset signal, wherein the flip flop is configured to generate a preset enable signal at an inverted output in response to the reset signal and the clock signal, wherein the preset enable signal is asserted for one clock cycle after the reset signal is de-asserted; and a logical AND circuit having a first input coupled to receive a preset value signal, a second input coupled to receive the preset enable signal from the flip flop, and an inverted input coupled to receive the reset signal, wherein the logical AND circuit is configured to generate the set bit signal.

8. The ramp generator of claim 7, wherein the logical AND circuit comprises:
a first AND gate having a first input coupled to receive the preset value, and a second input coupled to receive the preset enable signal from the flip flop; and
a second AND gate having a first input coupled to an output of the first AND gate, and an inverted input coupled to receive the reset signal, wherein the second AND gate is configured to generate the set bit signal.

9. The ramp generator of claim 7, wherein the logical AND circuit comprises:
a NOR gate having a first input coupled to receive the preset value, and an inverted input coupled to receive the preset enable signal from the flip flop; and
a NAND gate having a first input coupled to an output of the NOR gate, and an inverted input coupled to receive the reset signal, wherein the NAND gate is configured to generate the set bit signal.

10. The ramp generator of claim 1, wherein the ramp signal is coupled to a comparator circuit of an analog to digital converter coupled to a plurality of bitlines of an imaging system.

11. The ramp generator of claim 10, wherein the DC offset compensation current determined by the preset value added to the ramp signal is determined in response to a product of a frequency of the clock signal and a resistor capacitor (RC) time constant of a load coupled to the output of the ramp generator.

12. An imaging system, comprising:
a pixel array including a plurality of pixel circuits configured to generate image signals in response to incident light;
a control circuit coupled to the pixel array to control operation of the pixel array; and
a readout circuit coupled to the pixel array to read out the image signals from the pixel array through a plurality of bitlines, wherein the readout circuit includes an analog to digital converter (ADC) including a comparator circuit coupled to the plurality of bitlines to receive the image signals, wherein the comparator circuit is further coupled to receive a ramp signal from a ramp generator, wherein the ramp generator comprises:
a plurality of switched current sources coupled in parallel between a resistor and ground, wherein the ramp signal is configured to be generated at an output coupled to a node between the resistor and the plurality of switched current sources; and
a digital ramp control signal generator comprising a counter configured to generate the ramp control signal in response to a clock signal, wherein the ramp control signal comprises a plurality of bits, wherein each bit of the ramp control signal is coupled to control switching of a respective one of the plurality of switched current sources to generate the ramp signal,
wherein the digital ramp control signal generator is coupled to receive a reset signal to zero the ramp control signal, wherein the digital ramp control signal generator is further coupled to receive a set bits signal to initialize the ramp signal to a preset value after every reset of the ramp control signal to add a DC offset compensation current determined by the preset value to the ramp signal.

13. The imaging system of claim 12, further comprising function logic coupled to the readout circuit to store digital representations of the image signals from the pixel array.

14. The imaging system of claim 12, wherein the ramp control signal comprises M least significant bits (LSB s) and N most significant bits (MSB s), wherein the plurality of switched current sources comprises M LSB switched binary weighted current sources coupled to N MSB switched binary weighted current sources.

15. The imaging system of claim 14, wherein the digital ramp control signal generator comprises a ripple counter comprising a M+N flip flops.

16. The imaging system of claim 15, wherein each of the M+N flip flops of the ripple counter is coupled to receive the reset signal to zero the ramp control signal.

17. The imaging system of claim 16, wherein the M LSB flip flops of the ripple counter are coupled to receive the set bits signal to initialize the ramp control signal to the preset value after every reset of the ramp signal to add a DC offset compensation current to the ramp signal, wherein the N MSB flip flops of the ripple counter are not coupled to receive the set bits signal.

18. The imaging system of claim 12, further comprising a set bit control signal generator configured to generate the set bit signal in response to the clock signal, the reset signal, and a preset value signal.

19. The imaging system of claim 18, wherein the set bit control signal generator comprises:
a flip flop having an input coupled to a logic high value, a clock input coupled to receive the clock signal, and a reset input coupled to receive the reset signal, wherein the flip flop is configured to generate a preset enable signal at an inverted output in response to the reset signal and the clock signal, wherein the preset enable signal is asserted for one clock cycle after the reset signal is de-asserted; and
a logical AND circuit having a first input coupled to receive a preset value signal, a second input coupled to receive the preset enable signal from the flip flop, and an inverted input coupled to receive the reset signal, wherein the logical AND circuit is configured to generate the set bit signal.

20. The imaging system of claim 19, wherein the logical AND circuit comprises:
a first AND gate having a first input coupled to receive the preset value, and a second input coupled to receive the preset enable signal from the flip flop; and
a second AND gate having a first input coupled to an output of the first AND gate, and an inverted input coupled to receive the reset signal, wherein the second AND gate is configured to generate the set bit signal.

21. The imaging system of claim 19, wherein the logical AND circuit comprises:
a NOR gate having a first input coupled to receive the preset value, and an inverted input coupled to receive the preset enable signal from the flip flop; and
a NAND gate having a first input coupled to an output of the NOR gate, and an inverted input coupled to receive the reset signal, wherein the NAND gate is configured to generate the set bit signal.

22. The imaging system of claim 12, wherein the DC offset compensation current determined by the preset value added to the ramp signal is determined in response to a product of a frequency of the clock signal and a resistor capacitor (RC) time constant of a load coupled to the output of the ramp generator.

* * * * *

UNITED STATES PATENT AND TRADEMARK OFFICE
CERTIFICATE OF CORRECTION

PATENT NO. : 11,627,273 B2
APPLICATION NO. : 17/217950
DATED : April 11, 2023
INVENTOR(S) : Tao Sun Page 1 of 1

It is certified that error appears in the above-identified patent and that said Letters Patent is hereby corrected as shown below:

In the Claims

In Column 12, Line 36, delete "(LSB s)" and insert -- (LSBs) --, therefor.

In Column 12, Line 37, delete "(MSB s)," and insert -- (MSBs), --, therefor.

In Column 14, Line 8, delete "(LSB s)" and insert -- (LSBs) --, therefor.

In Column 14, Line 9 (Approx.), delete "(MSB s)," and insert -- (MSBs), --, therefor.

Signed and Sealed this
Twenty-fourth Day of October, 2023

Katherine Kelly Vidal
*Director of the United States Patent and Trademark Office*